United States Patent

Kobayashi et al.

[11] Patent Number: 5,802,714
[45] Date of Patent: Sep. 8, 1998

[54] METHOD OF FINISHING A PRINTED WIRING BOARD WITH A SOFT ETCHING SOLUTION AND A PRESERVING TREATMENT OR A SOLDER-LEVELING TREATMENT

[75] Inventors: Shiro Kobayashi, Isehara; Masami Kawaguchi, Hadano, both of Japan

[73] Assignee: Hitachi, Ltd., Tokyo, Japan

[21] Appl. No.: 483,988

[22] Filed: Jun. 7, 1995

[30] Foreign Application Priority Data

Jul. 19, 1994  [JP]  Japan ................................. 6-165677

[51] Int. Cl.⁶ ........................................................ H05K 3/10
[52] U.S. Cl. .................. 29/852; 216/17; 427/97; 430/318
[58] Field of Search ........................ 29/852, 846; 156/60, 156/659.11, 656.1; 216/13, 17, 106; 427/97, 304; 430/314, 318; 428/900, 901

[56] References Cited

U.S. PATENT DOCUMENTS

| | | | |
|---|---|---|---|
| 3,675,318 | 7/1972 | Merkenschlager | 29/852 |
| 5,028,513 | 7/1991 | Murakami et al. | 430/318 X |
| 5,358,602 | 10/1994 | Sutcliffe et al. | 216/13 |
| 5,445,698 | 8/1995 | Takano et al. | 156/60 |
| 5,504,992 | 4/1996 | Fukutomi et al. | 29/852 X |

FOREIGN PATENT DOCUMENTS

| | | | |
|---|---|---|---|
| 0049299 | 2/1989 | Japan | 29/852 |
| 0082692 | 3/1989 | Japan | 29/852 |

OTHER PUBLICATIONS

"Manufacturing Methods of a Printed Circuit Board," edited and issued by the Association of Japan Printed Circuit Industry (a corporation) (Dec. 1, 1989), pp. 109–111.

*Primary Examiner*—Peter Vo
*Assistant Examiner*—Khan Nguyen
*Attorney, Agent, or Firm*—Fay, Sharpe, Beall, Fagan, Minnich & McKee

[57] ABSTRACT

The invention presents a method of finishing a printed circuit board by using a soluble chloride added to a soft etching solution, the soluble chloride provides a source of chloride ions that beneficially combine with plated copper to form a protective CuCl layer. The protective layer is desirably used to prevent overetching of a copper film in a via or through-hole of a printed wiring board.

11 Claims, 4 Drawing Sheets

METHOD OF FINISHING A PRINTED WIRING BOARD WITH A SOFT ETCHING SOLUTION AND A PRESERVING TREATMENT OR A SOLDER-LEVELING TREATMENT

BACKGROUND OF THE INVENTION

1. Field of the Invention

The present invention relates to printed wiring boards for mounting electronic parts and methods of finishing printed wiring boards, and more particularly to a soft etching solution used in finishing printed wiring boards having copper-plated holes.

2. Description of the Related Art

Conventionally, a preserving treatment or a solder leveling treatment have constituted the final step of manufacturing a printed wiring board that has copper-plated through-holes and via holes. In a preserving treatment, a protective coating is formed on the surface of a copper foil exposed on a part-mounting surface of a printed wiring board. The protective coating prevents oxidation, corrosion, and adhering of foreign objects on the mounting face while the printed wiring board is being stored prior to mounting parts on the board. Thus, the solderability of the board is maintained.

Three kinds of preservatives are commonly known for use in the preserving treatment: a rosin group, a synthetic resin group, and an adsorbent group. However, use of the rosin group and the synthetic resin group has been restricted because flon group organic solvents have been used for post-treatment cleaning and as a treating agent. By contrast, the adsorbent group preservative is water-soluble, and does not use an organic solvent; therefore, for environmental reasons, the adsorbent group preservative is considered superior to the former derivatives.

Further, although there have been many adsorbent group preservatives having inferior heat resistances as compared to that of the rosin group or the synthetic resin group, a water-soluble derivative of the adsorbent group has recently become commercially available which has excellent heat resistance. The major component of this water-soluble derivative includes a water-soluble heterocyclic compound having an adsorption functional group containing nitrogen, such as benzotriazole, alkylbenzoimidazole, or the like.

The following steps are generally used in the conventional preserving treatment.

| | |
|---|---|
| (1) | Degreasing → (2) rinsing → (3) soft etching → |
| (4) | rinsing → (5) pickling → (6) rinsing → (7) coating of preservative → (8) rinsing → (9) drying. |

In certain cases, the steps of (5) pickling and (6) rinsing are omitted. Further, a solder resist is normally formed on copper foil surfaces other than the mounting face, prior to the preserving treatment (that is, prior to step (1)). An epoxy group resin or the like is a suitable solder resist.

In a solder leveling treatment, solder is coated on the surface of the copper toil exposed on the mounting race and on inner walls of holes, such as via holes and through-holes. This treatment is performed to prevent the mounting face from changing, especially deteriorating, in quality while the board is stored prior to mounting parts thereon, ensuring solderability. Also, the solder leveling treatment provides a precoating of solder for the board.

The solder leveling treatment includes steps of pretreatment, leveling, and posttreatment after forming a solder resist on those exposed portions of the substrate other than the mounting face. Typically, hot air leveling is employed as the leveling step.

After cleaning the copper surface, the pretreatment is performed as follows:

(1) Degreasing→(2) rinsing→(3) soft etching→(4) rinsing→(5) pickling→(6) rinsing→(7) drying.

For hot air leveling, molten solder is uniformly coated on the mounting surface according to the following procedure, by a vertical or horizontal leveling device:

(1) Coating of flux→(2) dipping of solder→(3) hot air leveling.

After coating with flux to enhance the solder wettability, the subatrate is dipped in a tank of molten solder, air is blown on the substrate when the solder is removed from the solder tank, and solder extraneously adhering to the surface and to the inside of holes is removed, by which the thickness of the solder coating layer is made uniform.

For posttreatment, the flux is cleaned and removed, and the board is rinsed and dried.

"Manufacturing Methods of a Printed Circuit Board," edited and issued by the Association of Japan Printed Circuit Industry (a corporation) (Dec. 1, 1989), pages 109–111, discloses an example of a conventional solder leveling treatment technology as discussed above.

The conventional technology, however, has not sufficiently recognized and solved problems associated with the soft etching solution remaining on the inner walls of via and through-holes as a result of the preserving treatment or the solder leveling pretreatment procedure. The problem is especially acute for current-technology printed wiring boards which have holes of reduced diameter. When the etching solution remains in the holes, overetching of the copper film occurs, resulting in disconnections in the holes. When the printed wiring board is a multilayer board, the disconnections prevent effective signal transfer between layers.

An attempt has been made to block the inlets of holes with a solder resist to prevent the treatment solution from invading the holes. However, practically, it is difficult to completely prevent the treatment solution from entering the holes. As well, it is quite difficult to completely remove the treatment solution from the holes by cleaning.

FIGS. 1(a)–1(c) illustrate this problem for the case of solder leveling pretreatment. As shown in FIG. 1(a), a liquid solder resist 4 is coated on one face (the bottom face in the figure) of a substrate 1, on which is previously formed a copper foil 2, so that the inlet of a via hole 3, for example, is filled. Then, the liquid solder resist 4 is hardened. The other face is similarly coated with the solder resist.

Next, although both inlets of the hole 3 are similarly filled, air trapped in the hole 3 expands due to the heat of the drying step, which causes an opening to be formed in the solder resist. During the subsequent soft etching step, etching solution 5 enters and remains inside the hole 3, even during the rinsing and pickling steps (FIG. 1(b)). The etching solution is locally condensed in the drying step, resulting in a disconnection 7, as shown in FIG. 1(c).

In the case of the preserving treatment, even though a preserving film is present in the state shown in FIG. 1(b), a disconnection is similarly formed as a result of the condensed etching solution.

SUMMARY OF THE INVENTION

According to the teachings of the present invention, a printed wiring board is finished without disconnections forming in its holes. Particularly, even though a soft etching solution is used in the finishing treatment, no disconnections are formed in the holes of the printed wiring board.

To achieve the objectives of the invention, the soft etching treatment is performed using a solution containing a soluble chloride. As a result, a protective film containing CuCl is formed on the surface of at least a portion of the exposed copper film.

More particularly, the soft etching solution preferably contains at least one nonoxidizing acid selected from the group consisting of sulfuric acid, phosphoric acid, and acetic acid; aqueous hydrogen peroxide; and at least one soluble chloride selected from the group consisting of lithium chloride, sodium chloride, potassium chloride, rubidium chloride, and cesium chloride.

To prevent the disconnections from occurring due to presence of the soft etching solution in the holes of the printed wiring board, the protective film containing CuCl is provided on the surface of the copper exposed inside the holes. The protective film may be constituted by CuCl alone, or a composite film of CuCl and another preservative.

Further, according to the invention, it is possible to perform a preserving treatment on the printed wiring board after the soft etching treatment. The preserving solution used in the treatment preferably includes at least one compound selected from the group consisting of alkylbenzoimidazole, benzotriazole, and their derivatives.

DETAILED DESCRIPTION OF THE PREFERRED EMBODIMENTS

Figure 1A:
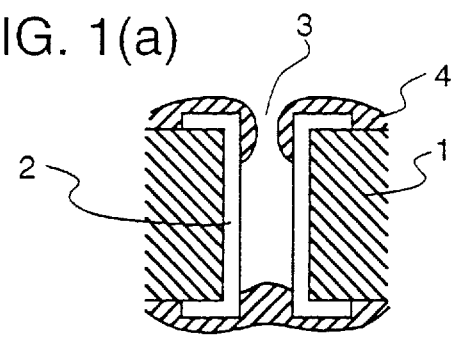
FIGS. 1(a)–1(c) illustrate sectional views of part of a printed wiring board for explaining a problem with the conventional finishing treatment of a copper-plated through-hole printed wiring board.
Figure 1B:
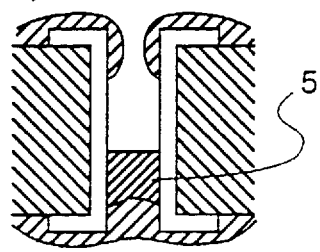
Figure 1C:
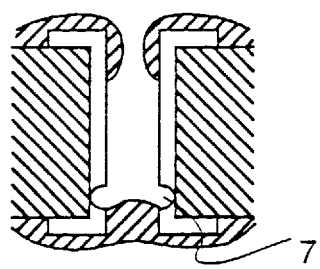

Throughout the disclosure, the term holes is used generically in discussing the copper-plated holes that are subject to overetching by a soft etching solution. Thus, the term is used to represent, for example, holes that are somewhat larger (about 0.6–0.7 mm) for electrically connecting the two surfaces of the wiring board (commonly called "through-holes"), and holes that are somewhat smaller (about 0.3 mm) for electrically connecting individual layers of the laminated board ("via holes"). No limitation on the scope of the invention should be inferred by such usage in this disclosure.

FIGS. 2(a)–2(d) illustrate successive sectional views of a portion of a printed wiring board, in which a hole 3 (for example, a via hole) is formed in a substrate 1 of a printed wiring board. Typically, a wiring pattern is formed on the laminate wiring board by a normal subtractive method (drilling, copper plating, imaging of resist for etching, and etching). A copper foil 2 remains in the holes of the printed wiring board.

Thereafter, as the final finishing step, a solder resist 4 is formed on both faces of the substrate 1. The solder resist 4 is formed by screen printing or by a photoresist technique, for example. However, for a high-density substrate in which hole diameters are very small, the photoresist system is preferred because of its high resolution.

The photoresist method forms the solder resist by exposing and developing the substrate after coating it with a photosensitive liquid resist or after laminating a photosensitive dry film on the substrate, as is known. By employing the method of forming a solder resist by laminating a photosensitive dry film, those holes that are not destined to accommodate circuit elements can be completely filled; therefore, the treatment solution cannot invade to cause disconnections as a result of the preserving treatment step. However, the dry film system has a drawback in that the dry film does not adhere well in fine patterning. Thus, a liquid resist is more commonly used.

According to a preferred embodiment, liquid solder resist is coated on both faces of the substrate 1 and hardened, to form the solder resist 4 on both surfaces of the substrate 1 which covers the via hole 3.

When using a liquid resist system, the liquid resist is first coated on one face, which is then exposed and developed, and thereafter the other face is similarly treated to form the solder resist. As noted above, by this method, it is not practically possible to completely fill both ends of holes that extend through the substrate. Normally, only one hole inlet can be filled. Thus, when the preserving treatment or solder leveling pretreatment is carried out after the resist is formed, the treatment solution enters and remains in the hole. If left untreated, the treatment solution will cause a disconnection due to overetching. However, according to the invention, the disconnections can be substantially prevented.

After the solder resist is formed, the following preserving treatment, which is broadly similar to that of the prior art, is performed:

---

(1) Degreasing → (2) rinsing → (3) soft etching →
(4) rinsing → (5) pickling → (6) rinsing → (7) coating of preservative → (8) rinsing → (9) drying.

---

The respective steps are performed by spraying chemicals or rinse water on both faces of the substrate 1 while moving the substrate.

The degreasing agent may be an alkaline solution or a surfactant. Preferably, a solution of persulfate or a solution of a sulfuric acid-hydrogen peroxide group (concentration: 0.1 to 10 mol/l) is used with a nonoxidizing acid (concentration: 0.1 to 5 mol/l) in the soft etching solution. The pickling solution is diluted sulfuric acid, and benzotriazole or alkylbenzoimidazole is used as the preservative (concentration: 0.01 to 10 wt %). Of particular importance is the application of chloride ions in the soft etching solution.

When a substrate face has been treated with a preservative and cleaned by the soft etching/pickling steps, the copper-plated surface is left with a preservative film which enhances the solder wettability for mounting electronic parts, for example. However, as noted before, some of the soft etching solution remains behind in holes of the wiring board, condensing in the drying step after the preservative is coated (FIG. 2(b)).

To prevent disconnections, the present invention provides for the addition of chloride ions in the soft etching solution.

Figure 2A:
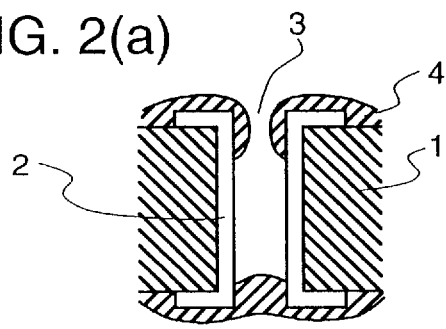
FIGS. 2(a)–2(d) show sectional views of part of a printed wiring board hole for explaining a finishing treatment of the printed wiring board according to the teachings of the present invention.
Figure 2B:
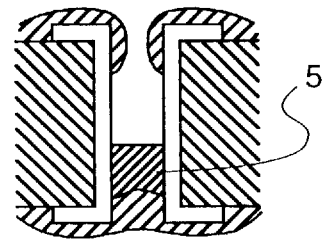
Figure 2C:
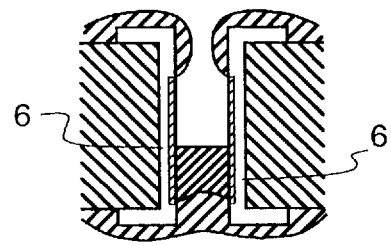
Figure 2D:
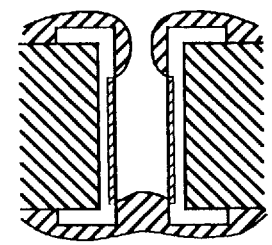

The chloride ions liberated in the soft etching solution bond to the copper plating to form, in the pickling step for example, a protective film 6, as shown in FIG. 2(c). The protective film 6 retards the etching of the copper in the holes for a period of time sufficient to allow the soft etching solution to be removed.

Preferably, the chloride ion source is one or more soluble chlorides that are water-soluble and have no side effects (for instance, a chloride of an alkali metal). Suitable examples, as mentioned, include NaCl, LiCl, KCl, RbCl, and CsCl (although NaCl and KCl are preferred from the standpoints of availability, cost, and safety, both environmental and personal). Other examples exist, but some metal chlorides that can form Cl⁻ ions have etch rates that are too high and form undesirable residues.

The concentration of the soluble chloride is preferably in a range of 0.001 mmol/l to 10 mmol/l and, more preferably, in a range of 0.01 mmol/l to 10 mmol/l. When the concentration is not larger than 0.001 mmol/l, the etching rate of copper is large. When the concentration is in a range of 0.001 mmol/l to less than 0.01 mmol/l, the etching rate of copper is not sufficiently small. Further, when the concentration exceeds 10 mmol/l, the etching rate is again increased.

By way of a specific example, the solder resist 4 was formed on a copper-covered laminate (of thickness 1.6 mm) in which were formed copper-plated through-holes having 0.3 mm diameter, and 0.001 mmol/l of NaCl was added to the soft etching solution. The soft etching solution also contained an oxidant. Accordingly, when the preserving treatment was performed by the soft etching solution, the oxidant combined with the NaCl to form Cl⁻ ions, which bonded with the copper plating to form a CuCl composite preservative film 6.

The soft etching solution further included a solution of a sulfuric acid-hydrogen peroxide group (sulfuric acid: 1 mol/l, hydrogen peroxide: 1 mol/l). The pickling solution was diluted sulfuric acid, and a solution of 1 wt % of alkylbenzoimidazole was used as the preservative. Thereafter, the number of disconnected through-holes was counted by measuring the resistance of the through holes, by which a disconnection ratio was calculated. For this example, the disconnection ratio was 0.01% or less.

As a comparative example, the disconnection ratio was calculated with respect to a board treated according to conventional technology, which did not include chloride ions in the soft etching solution. In this comparative example, the disconnection ratio was between 0.05% and 1.5%. Thus, the disconnection ratio of the inventive example was considerably lower than that of the comparative example, evidencing the superior results of the invention. Moreover, the wettability of solder in the inventive example was the equal of the comparative example wettability.

Similar results were obtained when LiCl, KCl, RbCl, or CsCl were substituted for the NaCl in similar concentrations. Moreover, when a plurality of the chlorides were simultaneously used, with the same total concentration of chlorides, similar results were obtained. As well, benzotriazole or its derivatives, or derivatives of alkylbenzoimidazole, give rise to similar results when substituted for the alkylbenzoimidazole as the preservative.

In another embodiment, the solder resist 4 is formed on the faces of a copper-covered laminate on which a wiring pattern is fabricated as in the previous embodiment. In this embodiment, a solder leveling pretreatment is performed, with the following steps:

(1) Degreasing→(2) rinsing→(3) soft etching→(4) rinsing→(5) pickling→(6) rinsing→(7) drying.

The chemical treatments are performed by spraying the various chemicals and rinse water onto both faces of the substrate while moving the substrate. An alkaline solution or a surfactant is used as a degreasing agent. A solution of persulfate or a solution of a sulfuric acid-hydrogen peroxide group is used as the soft etching solution, and diluted sulfuric acid as the pickling solution. As for the previous embodiment, this embodiment includes a source of chloride ions in the soft etching solution.

Again, a protective film 6 comprising CuCl is formed in the pickling step or in the drying step, and the etching of copper as a result of the soft etching solution condensation is retarded (notably, posttreatment soldering removes CuCl from the surface of the wiring board, but not from the hole walls). Thus, disconnections in the holes are reduced if not prevented altogether.

In a specific example of this embodiment, the solder resist 4 was formed on the copper-covered laminate (of thickness 1.6 mm) having copper through-holes of 0.3 mm diameter. The solder leveling pretreatment was performed as outlined above.

The soft etching solution included NaCl dissolved in a sulfuric acid-hydrogen peroxide group (sulfuric acid: 1 mol/l, hydrogen peroxide: 1 mol/l) to a concentration of 0.001 mmol/l. The pickling solution was a diluted sulfuric acid. Thereafter, the solder leveling treatment was performed, the printed wiring board was finished, and the hole resistances were measured. The disconnection ratio was 0.01% or less.

For a comparative example, the disconnection ratio was calculated for a printed wiring board finished according to the conventional technology, in which no chloride ion source was provided for the soft etching solution. Again, the disconnection ratio was between 0.05% and 1.5%. The superior results of the present invention are evident.

Similar results were observed when LiCl, KCl, RbCl, or CsCl were individually substituted as the chloride ion source in the soft etching solution. Further, when a plurality of these chlorides were simultaneously employed, similar results were again obtained for concentrations like those described above.

Figure 3A:
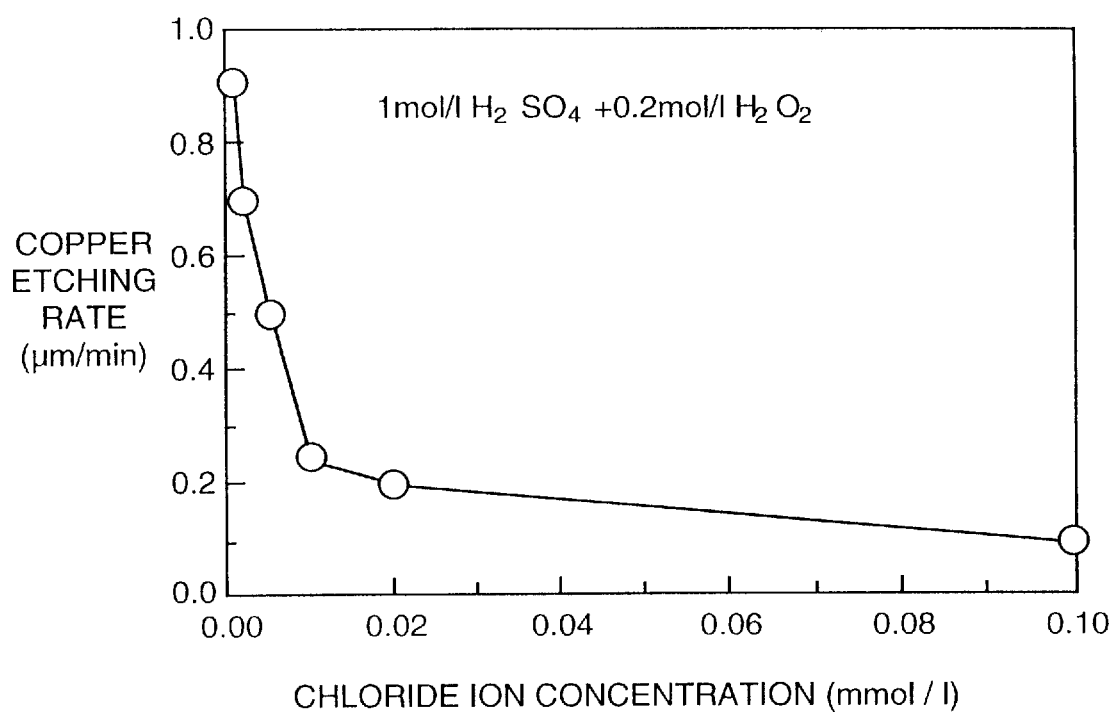
FIG. 3(a) plots copper etching rate against chloride ion concentration to show the influence of chloride ions on the etching rate of copper according to the teachings of the present invention.
Figure 3B:
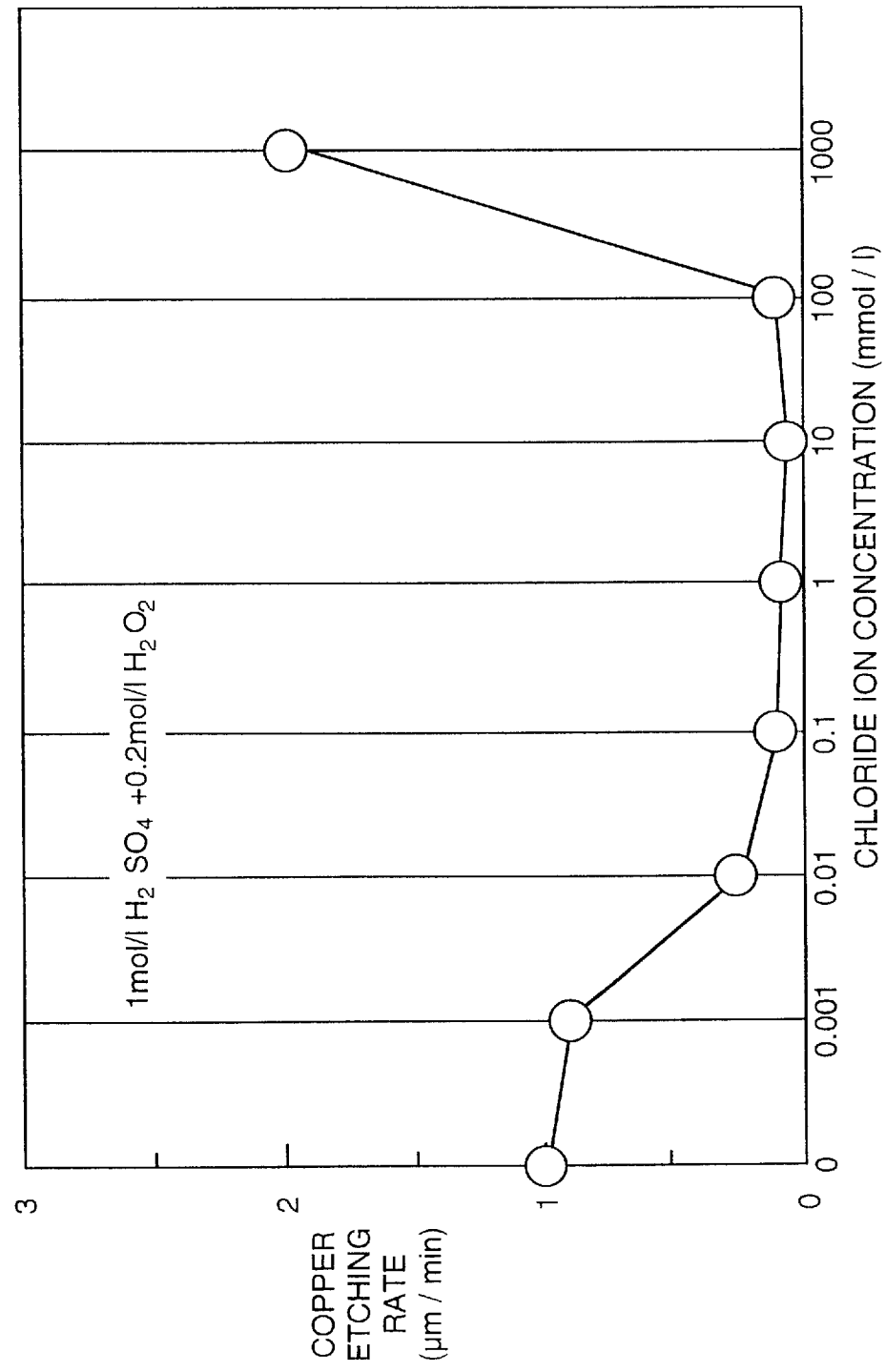
FIG. 3(b) plots the same data as FIG. 3(a), but on a semilogarithmic graph to show the effects of chloride ion concentrations greater than 0.1 mmol/l.

FIGS. 3(a) and 3(b) graphically illustrate the influence of chloride ions on the etch rate of copper. FIG. 3(a) is plotted on a linear-linear graph, and illustrates how even a small amount of chloride ions in the soft etching solution can retard or substantially prevent the undesired etching of copper, due to the formation of the protective CuCl film from a reaction between the copper and the chloride ions.

More specifically, the concentration of the soluble chloride is preferably in a range of 0.001 mmol/l to 10 mmol/l and, more preferably, in a range of 0.01 mmol/l to 10 mmol/l. When the concentration is not larger than 0.001 mmol/l, the etching rate of copper is large. When the concentration is in a range of 0.001 mmol/l to less than 0.01 mmol/l, the etching rate of copper is not sufficiently small. Further, when the concentration exceeds 10 mmol/l, the etching rate is again increased.

It should be noted that the amount of soft etching necessary for the preserving treatment cannot be controlled if the addition concentration is not controlled. The chloride ions along with copper form a stable protective film under an acidic condition, and as a major component of the soft etching solution, a mixed solution of nonoxidizing acid such as sulfuric acid and aqueous hydrogen peroxide is preferred.

FIG. 3(b) is a semilogarithmic plot of the copper etch rate vs. chloride ion concentration, showing the effect of chloride ion concentrations above the 0.01 mmol/l maximum shown in FIG. 3(a). The etch rate remains flat up to approximately 10 mmol/l, climbs slightly to about 100 mmol/l, and then increases markedly. The range of 0.01 mmol/l to 10 mmol/l was described generally above; the range above 10 mmol/l, while increasing, appears relatively flat. Still, the etch rate increases, leading to a greater probability of disconnections, and is thus not as preferable as the 0.01–10 mmol/l range.

While a key feature of the invention is the addition of a chloride ion source to the soft etching solution, it should be noted that hard etching solutions (such as $CuCl_2$ in solution) generate ions that do not contribute to forming a protective film on copper. "Hard etching" and "soft etching" may be defined in terms of the rate of etch. For example, a rate of 5 $\mu$m/min. or higher, and particularly 5–10 $\mu$m/min., is considered hard etching, whereas a rate of 1 $\mu$m/min. or lower is considered soft etching.

In the 1–5 $\mu$m/min. range, the etch has characteristics (and ramifications) of both hard and soft etching. For example, a manufacturing process may be hampered in that the 1–5 $\mu$m/min. range causes a loss of too much material to constitute an adequate soft etch, but not enough to be a suitable hard etch. Thus, to use the preferred embodiment of this invention, a printed wiring board manufacturing line may be set to process at a speed that takes advantage of a high or low (or nonexistent) etch rate, but could not take advantage of a medium etch rate to produce a printed wiring board that retains wiring metallization where needed without leaving behind material to be etched. For reference, a typical soft etching of a Cu wiring thickness of about 10–30 $\mu$m removes about 1 $\mu$m of Cu.

Various modifications of the invention will become apparent to those of ordinary skill upon reading the above disclosure. For example, it is considered that the soft etching solution that includes a soluble chloride can be employed for selective etching of a layer that must be etched, while leaving behind a Cu layer to be selectively protected. All such modifications that basically rely upon the teachings through which the invention has advanced the state of the art are properly considered within the spirit and scope of the invention.

We claim:

1. A method of finishing a printed wiring board having an exposed copper film, said method comprising soft-etching the printed wiring board using a solution containing a soluble chloride, wherein the printed wiring board has a hole lined with the exposed copper film, and wherein the soft etching step includes the step of forming a protective film containing CuCl on at least a portion of the exposed copper film in the hole.

2. A method of finishing a printed wiring board according to claim 1, wherein the soluble chloride is at least one selected from the group consisting of lithium chloride, sodium chloride, potassium chloride, rubidium chloride and cesium chloride.

3. A method of finishing a printed wiring board according to claim 2, further comprising the step of performing a solder leveling on the printed wiring board after the soft etching step.

4. A method of finishing a printed wiring board according to claim 2, further comprising the step of coating the printed wiring board with a preservative after the soft etching step.

5. A method of finishing a printed wiring board according to claim 4, wherein the coating step is performed by using a solution of at least one compound selected from the group consisting of alkylbenzoimidazole, benzotriazole, and derivatives of alkylbenzoimidazole and benzotriazole.

6. A method of finishing a printed wiring board according to claim 1, further comprising the step of performing a solder leveling on the printed wiring board after the soft etching step.

7. A method of finishing a printed wiring board according to claim 1, wherein the soluble chloride is sodium chloride.

8. A method of finishing a printed wiring board according to claim 1, further comprising the step of coating the printed wiring board with a preservative after the soft etching step.

9. A method of finishing a printed wiring board according to claim 8, wherein the soluble chloride is sodium chloride.

10. A method of finishing a printed wiring board according to claim 9, further comprising the step of coating the printed wiring board with a preservative after the soft etching step.

11. A method of finishing a printed wiring board according to claim 1, wherein the soft etching step is performed by using aqueous hydrogen peroxide and at least one non-oxidizing acid selected from the group consisting of sulfuric acid, phosphoric acid, and acetic acid.

* * * * *